(12) United States Patent
Chun

(10) Patent No.: US 7,164,301 B2
(45) Date of Patent: Jan. 16, 2007

(54) STATE RETENTION POWER GATING LATCH CIRCUIT

(75) Inventor: Christopher K. Y. Chun, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 92 days.

(21) Appl. No.: 11/125,462

(22) Filed: May 10, 2005

(65) Prior Publication Data

US 2006/0255849 A1 Nov. 16, 2006

(51) Int. Cl.
*H03K 3/289* (2006.01)
*H03K 3/356* (2006.01)

(52) U.S. Cl. ............ 327/202; 327/203; 327/208; 327/218

(58) Field of Classification Search ............. None
See application file for complete search history.

(56) References Cited

U.S. PATENT DOCUMENTS

| | | | | |
|---|---|---|---|---|
| 5,615,162 | A * | 3/1997 | Houston | 365/226 |
| 6,577,153 | B1 * | 6/2003 | Kodama | 326/27 |
| 6,836,175 | B1 * | 12/2004 | Morikawa | 327/534 |
| 2004/0008071 | A1 | 1/2004 | Ko et al. | |
| 2004/0213050 | A1 | 10/2004 | Fukuoka et al. | |
| 2004/0266092 | A1 * | 12/2004 | Aksamit | 438/222 |
| 2005/0218952 | A1 * | 10/2005 | Padhye et al. | 327/218 |

OTHER PUBLICATIONS

Satoski Shigematsu, *A 1-V High Speed MTCMOS Circuit Scheme for Power-Down Application Circuits*, IEEE Journal of Solid-State Circuits, vol. 32, No. 6, Jun. 1997.
Paul S. Levy, *Power-Down Intergrated Circuit Built-In Self-Test Structures*, IEEE VLSI Test Sumposium, Paper 2.1 1991, pp. 30-33.

* cited by examiner

*Primary Examiner*—Tuan T. Lam
(74) *Attorney, Agent, or Firm*—Gary R. Stanford

(57) ABSTRACT

A method of power gating a latch including detecting a state of the latch, detecting a power gate signal, providing power to the latch while the power gate signal is negated, and removing power from the latch when the power gate signal is asserted and the latch is in a predetermined state. The method may include any one or more of pulling a node of the latch to a selected state while the power gate signal is asserted to ensure that the latch powers up in the predetermined state, providing a signal indicative of the latch state and the power gate signal to respective inputs of a logic gate having an output indicative thereof, switching a supply voltage to a power input of the latch based on a state of the output of the logic gate, and closing a switch to pull a node of the latch low.

20 Claims, 3 Drawing Sheets

US 7,164,301 B2

STATE RETENTION POWER GATING LATCH CIRCUIT

BACKGROUND OF THE INVENTION

1. Field of the Invention

The present invention relates in general to electronic devices, and more particularly to an imbalanced state retention power gating (SRPG) latch circuit that forces a known state upon power-up depending upon the state being stored to save additional static leakage current.

2. Description of the Related Art

State retention power gating (SRPG) is a way to save static leakage current by powering down a majority of a synchronous digital logic block while maintaining power on the flip flops where the state of the digital logic is saved. Various forms of SRPG flip flops have been disclosed and described. The conventional SRPG configurations were implemented according to an assumption, however, that either state ("0" or "1") of the flip flop must be saved since it is unknown which state is required to be saved at any given time. The present disclosure challenges this assumption. A common flip flop configuration is a master-slave latch configuration in which a master latch feeds a slave latch. Existing configurations keep the slave latch of each flip flop alive (powered up) to maintain state while the rest of the logic, including each master latch, is power gated. The state saving latches remain powered and thus consume a significant amount of static leakage current in the powered down state.

It is desired to save even more static current by power gating at least some of the slave latches. Due to the unknown state of the data, however, more information is required to be used to make the determination of the whether the power can be gated to the slave latch or not.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The terms "a" or "an", as used herein, are defined as one or more than one. The term "plurality", as used herein, is defined as two or more. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Figure 1:
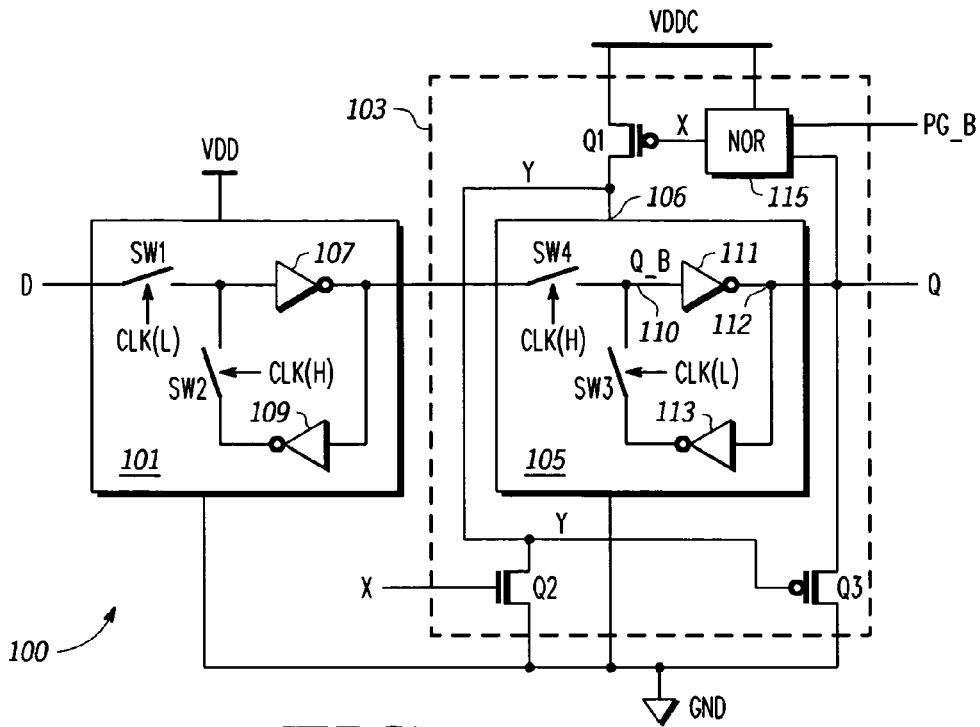
FIG. 1 is a schematic diagram of a flip flop including a slave latch circuit implemented according to an exemplary embodiment of the present invention for storing a logic zero during a powered down state.

FIG. 1 is a schematic diagram of a flip flop 100 including a slave latch circuit 103 implemented according to an exemplary embodiment of the present invention for storing a logic zero during a powered down state. The flip flop 100 includes a master latch 101 powered by a supply voltage VDD referenced to another supply voltage, such as ground (GND), and the slave latch circuit 103 powered by another supply voltage VDDC also referenced to GND. The slave latch circuit 103 includes a slave latch 105 configured in a similar manner as the master latch 101 as further described below. The master latch 101 receives an input signal D, which is provided to a first switched terminal of a switch SW1. The switch SW1 has a second switched terminal coupled to the input of an inverter 107 and to a first switched terminal of another switch SW2 of the master latch 101. The inverter 107 has an output coupled to the input of another inverter 109 and to a first switched terminal of another switch SW4 of the slave latch 105. The output of the inverter 109 is coupled to the second switched terminal of the switch SW2. The second switched terminal of switch SW4 is a node 110 which is coupled to a first switched terminal of another switch SW3 and to the input of another inverter 111 of the slave latch 105. The output of the inverter 111 provides an output signal Q on a node 112, which is coupled to the input of another inverter 113. The output of the inverter 113 is coupled to the second switched terminal of the switch SW3. Node 110 at the input of the inverter 111 develops a signal Q_B, which has the opposite logic state of the output signal Q during normal operation. A "B" appended at the end of the signal name denotes either a negative logic signal that is false when high (or logic one) and is true when low (or logic zero) or has the opposite state of the signal without the "B" appended to its name.

The latches 101, 105 are each configured as an inverter loop (e.g., back-to-back inverters, or cross-coupled inverters) with switches for latching an input state and for transferring the input to the output upon successive cycles of a clock signal CLK as known to those of ordinary skill in the art. Each of the switches SW1–SW4 is shown as normally-open single-pole, single-throw (SPST) switch having a control terminal receiving a clock signal. The switches SW1 and SW3 are shown as being controlled by a clock signal CLK(L) and the switches SW2 and SW4 are shown as being controlled by a clock signal CLK(H). The clock signals CLK(L) and CLK(H) are derived from a single master clock signal CLK, where CLK(H) represents the CLK signal when high and where CLK(L) represents the CLK signal when low. Thus, the switches SW1 and SW3 are both closed when CLK is low and are otherwise open, and the switches SW2 and SW4 are both closed when CLK is high and are otherwise open. When CLK closes the switches SW1 and SW3 and opens the switches SW2 and SW4, the input signal D is latched into the master latch 101 and the current state of the slave latch 105 is held on the output signal Q. When CLK closes the switches SW2 and SW4 and opens the switches SW1 and SW3, the state stored in the master latch 101 is transferred to the slave latch 105. Each of the switches SW1–SW4 may be implemented as any type of electronic switch as known to those skilled in the art, such as a field-effect transistor (FET) or the like or P-channel or N-channel metal-oxide semiconductor (PMOS or NMOS) transistors FETs or MOSFETs and the like.

The slave logic circuit 103 further includes a two-input NOR gate 115 having a first input receiving the output signal Q and a second input receiving a power gate signal PG_B. The PG_B signal is "negated" high during normal operation and is "asserted" low to initiate the powered down state. The NOR gate 115 has an output providing a signal X, which is provided to the gates of a PMOS transistor Q1 and an NMOS transistor Q2. The source of Q1 is coupled to VDDC and its drain is coupled to a power input of the slave latch 105 at a node 106. Node 106, which develops a signal Y is coupled to the drain of Q2 and to the gate of another PMOS transistor Q3. The source of Q2 and the drain of Q3 are coupled to ground. The NOR gate 115 and the transistors or switches Q1, Q2 and Q3 collectively form an imbalance circuit or state retention power gating circuit operative to "imbalance" the slave latch 105 as further described below. In particular, the imbalance or state retention power gating circuit powers down the slave latch 105 when the PG_B signal is asserted low if the slave latch 105 is in a predetermined state and to power up the slave latch 105 when the PG_B signal is negated.

The VDD supply voltage is powered down during a powered down or low power state, thereby removing power from the master latch 101. The stored state of the master latch 101 is thus lost during the powered down state. The VDDC supply voltage, however, remains alive or powered up even during the powered down state. In conventional configurations, the slave latch 105 or its equivalent remained active during the powered down state to save the logic state of the flip flop. A significant amount of static leakage current was required to maintain the logic state of the active circuitry of the slave latch in prior art, including, for example, keeping the inverters 111 and 113 powered up. In contrast, the flip flop 100 implemented according to an embodiment of the present invention uses the state of the slave latch 105 to determine whether power should also be removed from the slave latch 105 to conserve additional energy. In this case, the flip flop 100 is "imbalanced" and forces a power up state of logic zero or "0", so that if Q is at a logic zero ("0") state at power down, the slave latch 105 can also be powered down to save additional leakage current. In an alternative embodiment, described below, the slave latch 105 forces instead a power up state of logic one or "1", so that if Q is at a logic state one at power down, the slave latch 105 can also be powered down to save additional leakage current.

For the flip flop 100, Q1 and Q2 collectively form a complementary pair of switches collectively having first state for providing power to the slave latch 105 and a second state for powering down the slave latch 105. In a first state, X is low and Y is high so that Q1 is on and Q2 is off. Thus, Q1 couples the VDDC supply voltage to the power input node 106 of the slave latch 105 and Q3 is off. In a second state, X is high, which turns off Q1 and pulls Y low to power down the slave latch 105. Also, Q3 is turned on providing an internal imbalance to keep the output signal Q low during the powered down state. In general, the imbalance of a latch according to the present invention can be done internally (as for the flip flop 100) or it can be forced by an external signal. The use of an external signal is beneficial but not as beneficial as the internal configuration since the external configuration employs an extra control line that is routed to all flip flops. If Q is low when the PG_B signal is asserted low, the NOR gate 115 turns Q3 on to keep Q low during the powered down state and initially upon power up so that the slave latch 105 powers up with Q still low.

Figure 2:
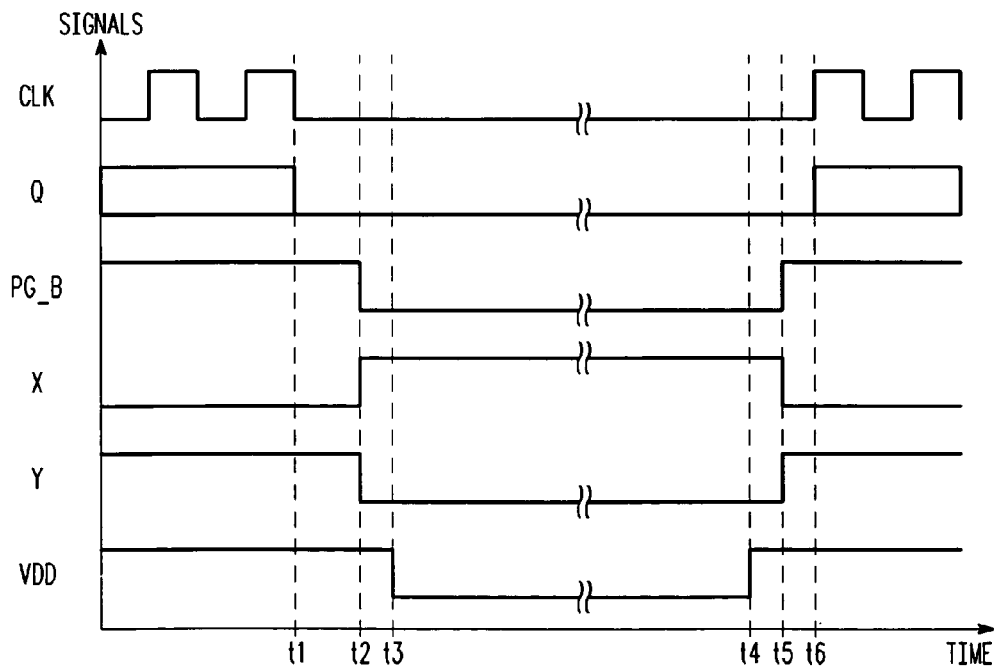
FIG. 2 is a timing diagram illustrating operation of the flip flop of FIG. 1 during a powered down state for saving a logic zero.

FIG. 2 is a timing diagram illustrating operation of the flip flop 100 during a powered down state for saving a logic zero. The CLK, Q, PG_B, X, Y and VDD signals are plotted versus time. The CLK signal is shown oscillating prior to a time t1 during normal operation, in which the saved state of the master latch 101 is transferred to the slave latch 105 on each rising edge of CLK as previously described. Thus the input D signal is transferred to the output Q signal upon successive cycles of CLK during normal operation. Also prior to time t1, the PG_B signal is negated high so that the X signal is held low by the NOR gate 115, which keeps Q1 turned on thereby keeping the Y signal high and providing power to the slave latch 105. Since X is low and Y is high, Q2 and Q3 both remain off. At time t1, the CLK signal is stopped and held low so that the switch SW4 is held open and the switch SW3 is held closed. The Q signal at time t1 is low and remains low immediately after time t1. Since PG_B is still high at time t1, X remains low and Y remains high so that the slave latch 105 remains powered. At subsequent time t2, the PG_B signal is asserted low to initiate the powered down state of the flip flop 100. Since both PG_B and Q are low at time t2, X is pulled high turning off Q1 and turning on Q2. Q2 pulls Y low, which turns on Q3 keeping Q low. When Q1 is turned off, power is removed from the slave latch 105 thereby significantly reducing static leakage current during the powered down state. At subsequent time t3, the VDD supply voltage is pulled low to complete the powered down state. During the powered down state, both the master latch 101 and the slave latch 105 are powered down.

The supply voltage VDDC remains powered up, so that the NOR gate 115 remains powered keeping the X signal high. Also, Q2 and Q3 are both on keeping Q low during the entire period of the powered down state. Nonetheless, a significant amount of leakage current is saved thereby conserving energy during the powered down state. As appreciated by those skilled in the art, Q1, Q2 and Q3 and the devices of the NOR gate 115 may be implemented with relatively slow devices and thus have longer than minimal lengths to minimize leakage current. Another method to minimize power is to implement the additional circuitry with higher threshold voltages. Thus, even though the NOR gate 115 and Q2–Q3 remained powered on, the inverters 111 and 113 are powered off so that a significant amount of leakage current is saved to conserve energy during the powered down state.

At subsequent time t4, the VDD supply voltage is pulled high to initiate powering up the flip flop 100. The master latch 101 is thus powered up at time t4. The state of D is determined by combinatorial logic (not shown) also being powered up, which provides the proper state of the D signal at power up. Since the CLK signal is still low, the state of D sets the states of the inverters 107 and 109 of the master latch 101. At time t5 shortly after time t4, the PG_B signal is negated high, which causes the NOR gate 115 to pull the X signal low. The X signal going low turns off Q2 and turns on Q1. Q1, when turned on, powers up the slave latch 105 while Q is still low. Also, Q1 starts pulling the Y signal high to turn off Q3. Yet since Q is initially low while the slave latch 105 begins to power up, the inverter 113 pulls its output high which pulls the input of the inverter 111 high via the switch SW3, which is still closed. Thus, Q3 keeps the output Q signal low during power up thereby maintaining the state of Q at power up equal to the original state of Q at power down. At time t6 shortly after time t5, the CLK signal is released and pulled high to begin oscillating again to resume normal powered up operation. The state of the master latch 101 is transferred to update the state of the slave latch 105, and normal operation is resumed.

It is noted that if the Q signal is high when the PG_B signal asserted low at time t2, that the NOR gate 115 keeps the X signal asserted low, which in turn keeps Q1 on during the powered down state. In this manner, the slave latch 105 remains powered on and Q3 remains turned off in the event that the Q signal is high when the powered down state is initiated.

Figure 3:
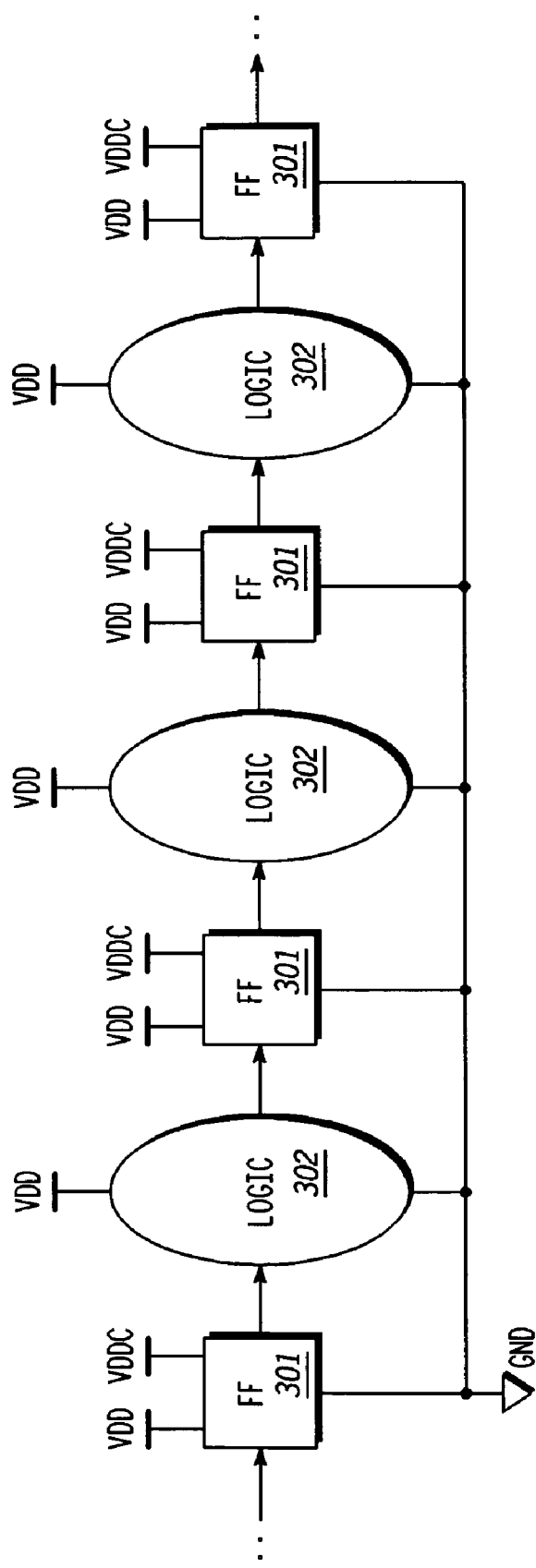
FIG. 3 is a simplified block diagram of an electronic circuit including multiple flip flops and multiple logic circuits coupled to and between the flip flops, in which each flip flop is configured according to that shown in either FIG. 1 or FIG. 4.

FIG. 3 is a simplified block diagram of an electronic circuit 300 including multiple flip flops 301 and multiple logic circuits 302 coupled to and between the flip flops 301. As shown, a flip flop 301 has an output coupled to an input of a logic circuit 302, which has an output coupled to the input of another flip flop 301, which has an output coupled to an input of another logic circuit 302, and so on. Each flip flop 301 includes a master latch and a slave latch, similar to the flip flop 100, and is powered by the VDD and VDDC supply voltages in a similar manner. Each logic circuit 302 is powered by the VDD supply voltage. In the conventional configuration, each logic circuit 302 and half of each flip flop 301 (e.g., each master latch) is powered down, while the other half of each flip flop 301 (e.g., each slave latch) would remain powered up during the powered down state. If each flip flop 301 is configured like the flip flop 100 according to the present invention, approximately half of the flip flops 301 are almost fully powered down on average. This is because approximately half of the flip flops 301 are assumed to be saving logic zero states whereas the other half are saving logic one states, so that the slave latches of those flip flops saving logic zero states may be fully powered down in the powered down state. Assuming a 20:1 ratio of logic gates between the logic circuits 302 and the flip flops 301, turning off half of each flip flop 301 provides a 40:1 power savings, and turning off the other half of approximately half of the flip flops 301 on average provides an 80:1 power savings during operation of the electronic circuit 300.

Figure 4:
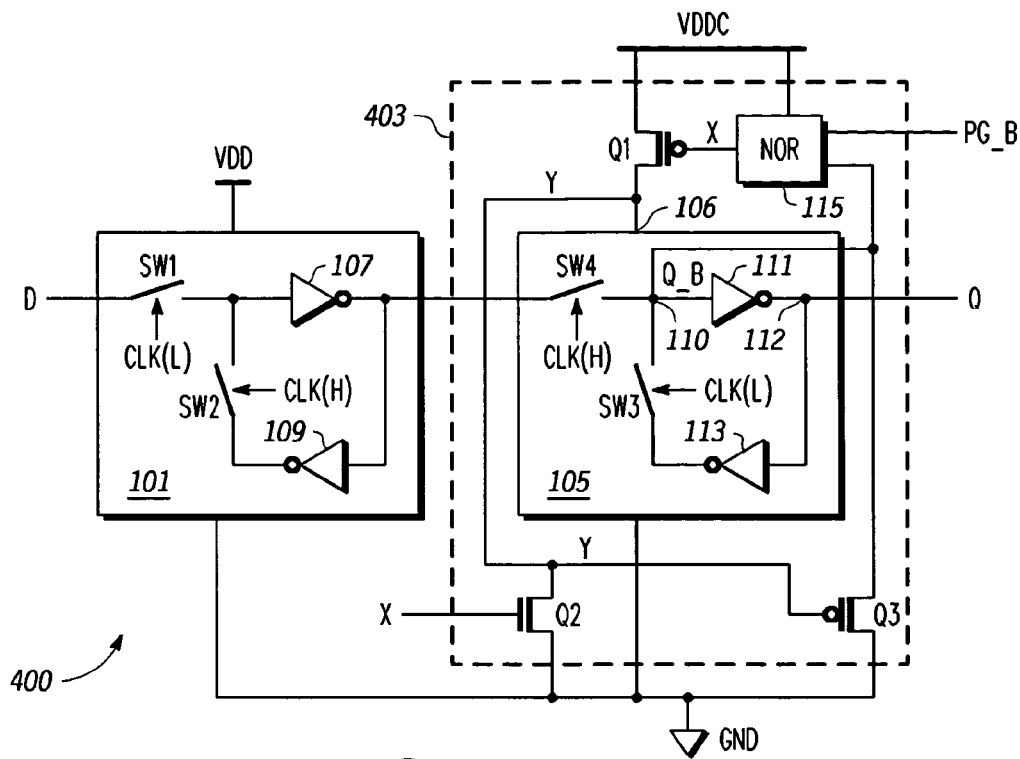
FIG. 4 is a schematic diagram of a flip flop including a slave latch circuit implemented according to another exemplary embodiment of the present invention for storing a logic one during the powered down state.

FIG. 4 is a schematic diagram of a flip flop 400 including a slave latch circuit 403 implemented according to another exemplary embodiment of the present invention for storing a logic one during the powered down state. The flip flop 400 is substantially similar to the flip flop 100 in which similar components assume identical reference numbers. The master latch 101 and the slave latch 105 are included and operate in a similar manner, except that for the slave latch circuit 403, the second input of the NOR gate 115 is instead coupled to node 110 (signal Q_B) at the input of the inverter 111 rather than its output. The drain of Q3 remains coupled to the second input of the NOR gate 115, so that it to is coupled instead to the input of the inverter 111 rather than its output. In general, the NOR gate 115 and Q3 are coupled at the input of the slave latch 105 rather than its output. Again, the NOR gate 115 and the transistors or switches Q1, Q2 and Q3 collectively form the imbalance or state retention power gating circuit operative to "imbalance" the slave latch 105 based on its state and the PG_B signal.

Figure 5:
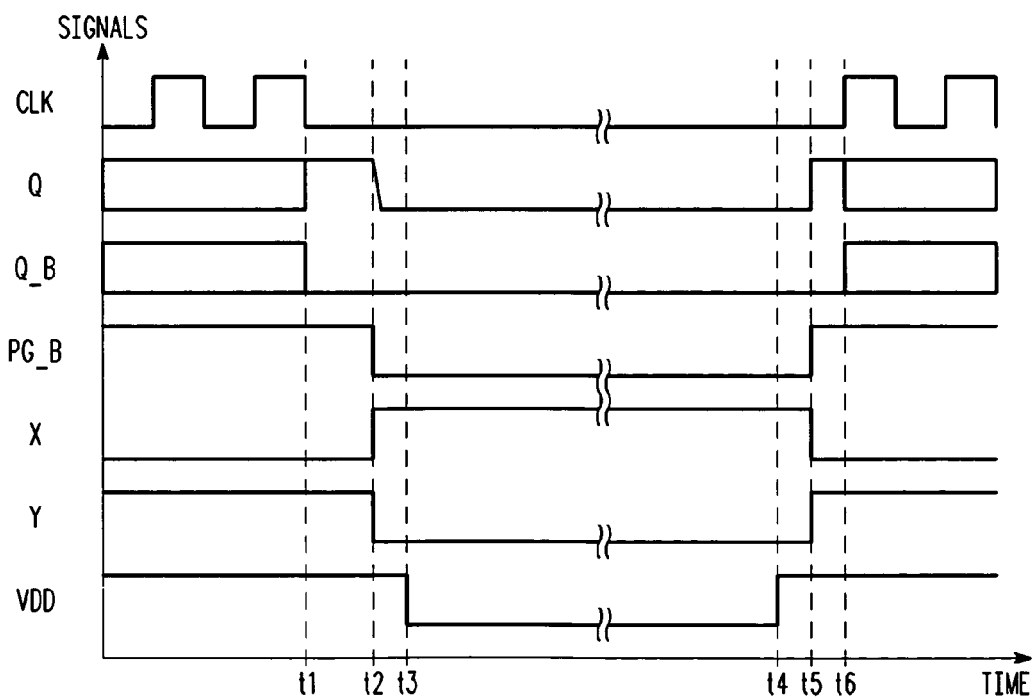
FIG. 5 is a timing diagram illustrating operation of the flip flop of FIG. 4 illustrating a powered down state for saving a logic one.

FIG. 5 is a timing diagram illustrating operation of the flip flop 400 illustrating a powered down state for saving a logic one. The CLK, Q, Q_B, PG_B, X, Y and VDD signals are plotted versus time. Again, the CLK signal is shown oscillating prior to a time t1 during normal operation, and is stopped and held low beginning at time t1 so that the switch SW4 is held open and the switch SW3 is held closed. In this case, the Q signal at time t1 is high and remains high immediately after time t1, so that the Q_B signal is low and remains low immediately after time t1. Since PG_B is still high at time t1, X remains low and Y remains high so that the slave latch 105 remains powered just after time t1. At subsequent time t2, the PG_B signal is asserted low to initiate the powered down state of the flip flop 400. Since both PG_B and Q_B are low at time t2, X is pulled high turning off Q1 and turning on Q2. Q2 pulls Y low, which turns on Q3 keeping the input of the inverter 111 and thus signal Q_B low. When Q1 is turned off, power is removed from the slave latch 105 thereby significantly reducing static leakage current during the powered down state. Also at time t2, the Q output signal collapses to a logic low and remains low during the powered down state. At subsequent time t3, the VDD supply voltage is pulled low to complete the powered down state. During the powered down state, both the master latch 101 and the slave latch 105 are powered down. The supply voltage VDDC remains powered up, so that the NOR gate 115 remains powered keeping the X signal high. Thus, Q1 remains off, and Q2 remains on keeping the Y signal low so that Q3 remains on. Q3 holds Q_B low during the powered down state. Again, Q1, Q2 and Q3 and the devices of the NOR gate 115 may be implemented with relatively slow devices and thus have longer than minimal lengths to minimize leakage current, or the additional circuitry is implemented with higher threshold voltages to minimize power. Thus, even though the NOR gate 115 and Q2–Q3 remained powered on, the inverters 111 and 113 are powered off so that a significant amount of leakage current is saved to conserve energy during the powered down state.

At subsequent time t4, the VDD supply voltage is pulled high to initiate powering up the flip flop 400. The master latch 101 is thus powered up at time t4. The state of D is determined by combinatorial logic (not shown) also being powered up, which provides the proper state of the D signal at power up. Since the CLK signal is still low, the state of D sets the states of the inverters 107 and 109 of the master latch 101. At time t5 shortly after time t4, the PG_B signal is negated high, which causes the NOR gate 115 to pull the X signal low. The X signal going low turns off Q2 and turns on Q1. Q1, when turned on, powers up the slave latch 105. Also, Q1 starts pulling the Y signal high to turn off Q3. Yet since Q3 is still on while the slave latch 105 is powered up, the Q_B signal is initially held low so that the inverter 111 pulls the Q output signal high. Thus, Q3 causes the inverter 111 to drive the Q output signal high during power up thereby maintaining the state of Q at power up equal to the original state of Q at power down, which is a logic one in this case. At time t6 shortly after time t5, the CLK signal is released and pulled high to begin oscillating again to resume normal powered up operation. The state of the master latch 101 is transferred to update the state of the slave latch 105, and normal operation is resumed.

It is noted that if the Q signal is low and the Q_B signal is high when the PG_B signal is asserted low, the NOR gate 115 keeps the X signal asserted low, which in turn keeps Q1 on during the powered down state. Thus, the slave latch 105 remains powered on and Q3 remains off in the event that the Q signal is low when the powered down state is initiated for the flip flop 400. Again, referring back to FIG. 3 and assuming a relatively large number flip flops 301, if each flip flop 301 is configured like the flip flop 400 according to an embodiment of the present invention, approximately half of the flip flops 301 are fully powered down on average providing an additional 80:1 power savings during operation of the electronic circuit 300. This is because approximately half of the flip flops 301 are assumed to be saving logic one states, so that the corresponding slave latches may also be powered down.

A state retention power gating latch circuit according to an embodiment of the present invention includes a latch having a power input and an imbalance circuit. The imbalance circuit has a first input receiving a power gate signal, a second input coupled to a selected node of the latch, a third input coupled to a supply voltage, and an output coupled to the power input of the latch. The imbalance circuit is operative to power down the latch while the power gate signal is asserted if the latch is in a predetermined state and to power up the latch into the predetermined state when the power gate signal is negated. In one embodiment, the imbalance circuit includes a logic gate and first, second and third switches. The logic gate has a first input receiving a power gate signal, a second input coupled to a selected node of the latch, and an output. The first switch has a first controlled electrode coupled to a supply voltage, a second controlled electrode coupled to the power input of the latch, and a control electrode coupled to the output of the logic gate. The second switch has a first controlled electrode coupled to the power input of the latch, a second controlled electrode coupled to a reference supply voltage, and a control electrode coupled to the output of the logic gate. The third switch has a first controlled electrode coupled to the selected node of the latch, a second controlled electrode coupled to the reference supply voltage, and a control electrode coupled to the power input of the first inverter loop. The second and third switches may be implemented as higher threshold voltage devices or the like with reduced leakage current to further reduce power consumption during the powered down state.

The latch may be configured as an inverter loop including an inverter with an input and an output. The selected node of the latch is either the input or the output of the inverter. In one embodiment, the second input of the logic gate is coupled to the output of the inverter. In this case, the logic gate switches the first, second and third switches to power down the inverter loop when the output of the inverter is low when the power gate signal is asserted in which the third switch keeps the output of the inverter low while the power gate signal is asserted. And the logic gate switches the first, second and third switches to power up the inverter loop when the power gate signal is negated, where the third switch provides an imbalance to keep the output of the inverter low so that the latch powers up in the correct state. In an alternative embodiment, the second input of the logic gate is coupled instead to the input of the inverter. In this case, the logic gate switches the first, second and third switches to power down the inverter loop when the output of the inverter is high when the power gate signal is asserted in which the third switch keeps the input of the inverter low while the power gate signal is asserted. And the logic gate switches the first, second and third switches to power up the inverter loop when the power gate signal is negated, where the third switch provides an imbalance to keep the input of the inverter low so that the latch powers up in the correct state.

The state retention power gating latch circuit may include multiple latches, each having a power input. In this case, an imbalance circuit is provided for each latch. Each imbalance circuit is operative to power down a corresponding latch while the power gate signal is asserted if the latch is in a first predetermined state and to maintain power to the latch while the power gate signal is asserted if the latch is in a second predetermined state.

A latching circuit according to an embodiment of the present invention includes a slave latch having an input, an output, and a power input, and a state retention power gating circuit. The state retention power gating circuit has a first input receiving a power gate signal, a second input coupled to a selected one of the input and output of the slave latch, a third input coupled to a first supply voltage, and an output coupled to the power input of said slave latch. The state retention power gating circuit is operative to power down the slave latch while the power gate signal is asserted if the slave latch is in a predetermined state and to power up the slave latch into the predetermined state when the power gate signal is negated. In one embodiment, the state retention power gating circuit includes a NOR gate, first and second PMOS transistors and an NMOS transistor. The NOR gate has a first input receiving a power gate signal, a second input coupled to a selected one of the input and output of the slave latch, and an output. The first PMOS transistor has a source coupled to a first supply voltage, a drain coupled to the power input of the slave latch, and a gate coupled to the output of the NOR gate. The NMOS transistor has a drain coupled to the power input of the slave latch, a source coupled to a reference supply voltage, and a gate coupled to the output of the NOR gate. The second PMOS transistor has a source coupled to the second input of the NOR gate, a drain coupled to the reference supply voltage, and a gate coupled to the power input of the slave latch.

In one embodiment of the state retention power gating latching circuit, the second input of the NOR gate is coupled to the output of the slave latch. In this case, the NOR gate switches the first and second PMOS transistors and the NMOS transistor to power down the slave latch when the output of the slave latch is low when the power gate signal is asserted, where the second PMOS transistor keeps the output of the slave latch low while the power gate signal is asserted. The NOR gate switches the first and second PMOS transistors and the NMOS transistor to power up the slave latch when the power gate signal is negated, where the second PMOS transistor keeps the output of the slave latch low to retain the proper state upon power up. In an alternatively embodiment, the second input of the NOR gate is coupled to the input of the slave latch. In this case, the NOR gate switches the first and second PMOS transistors and the NMOS transistor to power down the slave latch when the output of the slave latch is high when the power gate signal is asserted, where the second PMOS transistor keeps the input of the slave latch low while the power gate signal is asserted. And the NOR gate switches the first and second PMOS transistors and the NMOS transistor to power up the slave latch when the power gate signal is negated, where the second PMOS transistor keeps the input of the slave latch low to retain the proper state upon power up.

The state retention power gating latching circuit may be implemented as a flip flop, in which case a master latch is provided at the input of the slave latch. The master latch may be powered with a separate supply voltage so that may be completely powered down during the powered down state.

A method of power gating a latch according to an embodiment of the present invention includes detecting a state of the latch, detecting a power gate signal, providing power to the latch while the power gate signal is negated, and removing power from the latch when the power gate signal is asserted and the latch is in a first predetermined state. The method may include pulling a node of the latch to a second predetermined state while the power gate signal is asserted to ensure that the latch powers up in the first predetermined state. Pulling the node low may be achieved by closing a switch or the like. And if the latch includes an inverter with an input and an output, pulling the node low may be achieved by either pulling the input or the output of the inverter low depending upon the state of the latch to be saved. The method may include maintaining providing power to the latch when the power gate signal is asserted and the latch is in a second predetermined state. The method may include providing a signal indicative of the latch state and the power gate signal to respective inputs of a logic gate having an output indicative thereof. The method may include switching a supply voltage to a power input of the latch based on a state of the output of the logic gate.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention. Those of ordinary skill in the art will recognize that, based upon the teachings herein, several modifications may be made to the embodiments shown and described herein without departing from the spirit and scope of the invention. For example, an external signal may be provided to maintain the state of each slave latch during power down rather than the internal imbalanced configuration shown. The connection of the second input of the NOR gate 115 at node 110 for flip flop 400 may instead be coupled at the output of the inverter 113 since the switch SW3 is closed during the powered down state. The latches are implemented as inverter loops, where it is understood that different latch configurations may be used instead while keeping within the scope of the present invention. MOS type devices are shown, where it is understood that other types of devices may be employed, such as bipolar logic or the like. Positive logic implementations may be replaced with equivalent negative logic configurations. The present invention may be applied to any latch configurations including the master latch 101 if the data is to be stored in the master latch.

What is claimed is:

1. A state retention power gating latch circuit, comprising:
   a latch having a power input; and
   an imbalance circuit having a first input receiving a power gate signal, a second input coupled to a selected node of said latch, a third input coupled to a supply voltage, and an output coupled to said power input of said latch;
   wherein said imbalance circuit is operative to power down said latch while said power gate signal is asserted when said latch is in a predetermined state and to power up said latch into said predetermined state when said power gate signal is negated.

2. The state retention power gating latch circuit of claim 1, wherein said latch comprises an inverter loop comprising an inverter having an input and an output, and wherein said selected node is a selected one of said input and output of said inverter.

3. The state retention power gating latch circuit of claim 1, wherein said imbalance circuit comprises:

a logic gate having a first input receiving said power gate signal, a second input coupled to said selected node of said latch, and an output;
   a first switch having a first controlled electrode coupled to said supply voltage, a second controlled electrode coupled to said power input of said latch, and a control electrode coupled to said output of said logic gate;
   a second switch having a first controlled electrode coupled to said power input of said latch, a second controlled electrode coupled to a reference supply voltage, and a control electrode coupled to said output of said logic gate; and
   a third switch having a first controlled electrode coupled to said selected node of said latch, a second controlled electrode coupled to said reference supply voltage, and a control electrode coupled to said power input of said first inverter loop.

4. The state retention power gating latch circuit of claim 3, wherein said second and third switches are each implemented as higher voltage threshold devices with reduced leakage current.

5. The state retention power gating latch circuit of claim 3, wherein:
   said latch comprises an inverter loop comprising an inverter having an input and an output;
   wherein said selected node is said output of said inverter;
   wherein said second input of said logic gate is coupled to said output of said inverter;
   wherein said logic gate switches said first, second and third switches to power down said inverter loop when said output of said inverter is low when said power gate signal is asserted in which said third switch keeps said output of said inverter low while said power gate signal is asserted; and
   wherein said logic gate switches said first, second and third switches to power up said inverter loop when said power gate signal is negated.

6. The state retention power gating latch circuit of claim 3, wherein:
   said latch comprises an inverter loop comprising an inverter having an input and an output;
   wherein said selected node is said input of said inverter;
   wherein said second input of said logic gate is coupled to said input of said inverter;
   wherein said logic gate switches said first, second and third switches to power down said inverter loop when said output of said inverter is high when said power gate signal is asserted in which said third switch keeps said input of said inverter low while said power gate signal is asserted; and
   wherein said logic gate switches said first, second and third switches to power up said inverter loop when said power gate signal is negated.

7. The state retention power gating latch circuit of claim 1, wherein:
   said latch comprises a plurality of latches each having a power input;
   wherein said imbalance circuit comprises a plurality of imbalance circuits, each having a first input receiving said power gate signal, a second input coupled to a selected node of a corresponding one of said plurality of latches, a third input coupled to said supply voltage, and an output coupled to said power input of a corresponding latch; and
   wherein each imbalance circuit is operative to power down a corresponding latch while said power gate signal is asserted when said corresponding latch is in a first predetermined state and to maintain power to said corresponding latch while said power gate signal is asserted when said corresponding latch is in a second predetermined state.

8. A latching circuit, comprising:
a slave latch having an input, an output and a power input; and
a state retention power gating circuit having a first input receiving a power gate signal, a second input coupled to a selected one of said input and output of said slave latch, a third input coupled to a first supply voltage, and an output coupled to said power input of said slave latch;
wherein said state retention power gating circuit is operative to power down said slave latch while said power gate signal is asserted when said slave latch is in a predetermined state and to power up said slave latch into said predetermined state when said power gate signal is negated.

9. The state retention power gating latching circuit of claim 8, wherein said state retention power gating circuit comprises:
a NOR gate having a first input receiving said power gate signal, a second input coupled to said selected one of said input and output of said slave latch, and an output;
a first P-channel metal-oxide semiconductor (PMOS) transistor having a source coupled to said first supply voltage, a drain coupled to said power input of said slave latch, and a gate coupled to said output of said NOR gate;
an N-channel MOS (NMOS) transistor having a drain coupled to said power input of said slave latch, a source coupled to a reference supply voltage, and a gate coupled to said output of said NOR gate; and
a second PMOS transistor having a source coupled to said second input of said NOR gate, a drain coupled to said reference supply voltage, and a gate coupled to said power input of said slave latch.

10. The state retention power gating latching circuit of claim 9, wherein said second input of said NOR gate is coupled to said output of said slave latch, wherein said NOR gate switches said first and second PMOS transistors and said NMOS transistor to power down said slave latch when said output of said slave latch is low when said power gate signal is asserted in which said second PMOS transistor keeps said output of said slave latch low while said power gate signal is asserted, and wherein said NOR gate switches said first and second PMOS transistors and said NMOS transistor to power up said slave latch when said power gate signal is negated.

11. The state retention power gating latching circuit of claim 9, wherein said second input of said NOR gate is coupled to said input of said slave latch, wherein said NOR gate switches said first and second PMOS transistors and said NMOS transistor to power down said slave latch when said output of said slave latch is high when said power gate signal is asserted in which said second PMOS transistor keeps said input of said slave latch low while said power gate signal is asserted, and wherein said NOR gate switches said first and second PMOS transistors and said NMOS transistor to power up said slave latch when said power gate signal is negated.

12. The state retention power gating latching circuit of claim 8, further comprising a master latch having an output, a first switch interposed between said output of said master latch and said input of said slave latch and a second switch interposed between said output of said second inverter and said input of said first inverter of said slave latch.

13. A method of power gating a latch, comprising:
detecting a state of the latch;
detecting a power gate signal;
providing power to the latch while the power gate signal is negated; and
removing power from the latch when the power gate signal is asserted and the latch is in a first predetermined state.

14. The method of claim 13, further comprising pulling a node of the latch to a second predetermined state while the power gate signal is asserted to ensure that the latch powers up in the first predetermined state.

15. The method of claim 14, wherein said pulling a node of the latch to a second predetermined state comprises closing a switch to pull the node low.

16. The method of claim 15, said latch comprising an inverter having an input and an output, wherein said pulling a node of the latch to a second predetermined state comprises pulling the output of the inverter low.

17. The method of claim 15, said latch comprising an inverter having an input and an output, wherein said pulling a node of the latch to a second predetermined state comprises pulling the input of the inverter low.

18. The method of claim 13, further comprising maintaining providing power to the latch when the power gate signal is asserted and the latch is in a second predetermined state.

19. The method of claim 13, wherein said detecting a state of the latch and a power gate signal comprises providing a signal indicative of the latch state and the power gate signal to respective inputs of a logic gate having an output indicative thereof.

20. The method of claim 19, wherein said providing power to the latch and removing power from the latch comprises switching a supply voltage to a power input of the latch based on a state of the output of the logic gate.

* * * * *